United States Patent
Tian et al.

(10) Patent No.: US 12,392,826 B2
(45) Date of Patent: Aug. 19, 2025

(54) CIRCUIT FOR CONTROLLING CALIBRATION, ELECTRONIC DEVICE, AND METHOD FOR CONTROLLING CALIBRATION

(71) Applicant: CHANGXIN MEMORY TECHNOLOGIES, INC., Hefei (CN)

(72) Inventors: Kai Tian, Hefei (CN); Enpeng Gao, Hefei (CN); Zengquan Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 292 days.

(21) Appl. No.: 18/169,185

(22) Filed: Feb. 14, 2023

(65) Prior Publication Data
US 2023/0349973 A1    Nov. 2, 2023

Related U.S. Application Data

(63) Continuation of application No. PCT/CN2022/099870, filed on Jun. 20, 2022.

(30) Foreign Application Priority Data

Apr. 29, 2022 (CN) .......................... 202210475104.2

(51) Int. Cl.
*G01R 31/319* (2006.01)
*G01R 31/28* (2006.01)
*G01R 31/317* (2006.01)

(52) U.S. Cl.
CPC ..... *G01R 31/3191* (2013.01); *G01R 31/2834* (2013.01); *G01R 31/31724* (2013.01)

(58) Field of Classification Search
CPC ............ G01R 31/2834; G01R 31/3191; G01R 31/31724; G11C 7/1057; G11C 29/50008; G11C 29/028; G11C 29/022
USPC ......................................................... 714/724
See application file for complete search history.

(56) References Cited

U.S. PATENT DOCUMENTS

| 6,760,873 | B1 * | 7/2004 | Hao | ................ | G01R 31/31715 |
|-----------|------|--------|------|-----|---------------|
|           |      |        |      |     | 714/724 |
| 6,889,334 | B1   | 5/2005 | Magro |    |              |
| 7,495,645 | B2 * | 2/2009 | Jang | .................... | G09G 3/3648 |
|           |      |        |      |     | 345/92 |

(Continued)

FOREIGN PATENT DOCUMENTS

| CN | 101686051 A | 3/2010 |
|----|-------------|--------|
| CN | 106486155 A | 3/2017 |

(Continued)

*Primary Examiner* — Albert Decady
*Assistant Examiner* — Enam Ahmed
(74) *Attorney, Agent, or Firm* — Syncoda LLC; Feng Ma (57) ABSTRACT

A circuit for controlling calibration includes a process circuit, an off-chip calibration circuit and a mode switching circuit. The process circuit is configured to perform, in a first test mode, a process corner test on the memory to obtain a test result signal, the test result signal being used for determining a process corner parameter. The off-chip calibration circuit is configured to receive and store a first calibration code sent by a controller, the first calibration code being determined by the controller according to a current environment parameter of the memory and the process corner parameter.

16 Claims, 5 Drawing Sheets

(56) References Cited

U.S. PATENT DOCUMENTS

| | | | |
|---|---|---|---|
| 7,698,640 B2* | 4/2010 | Krieglstein | G09B 7/02 |
| | | | 434/317 |
| 8,238,180 B2 | 8/2012 | Jung | |
| 9,043,539 B2 | 5/2015 | Kaiwa | |
| 9,935,632 B1 | 4/2018 | Gans | |
| 10,090,836 B1 | 10/2018 | Gans | |
| 10,439,612 B1 | 10/2019 | Johnson | |
| 10,747,245 B1* | 8/2020 | He | G11C 29/12005 |
| 11,062,744 B2 | 7/2021 | Lee | |
| 11,145,383 B1 | 10/2021 | Lee | |
| 2007/0018864 A1* | 1/2007 | Khan | H03K 19/00384 |
| | | | 341/118 |
| 2007/0073506 A1 | 3/2007 | Boskovic | |
| 2008/0082878 A1* | 4/2008 | Check | G01R 31/31855 |
| | | | 714/724 |
| 2008/0304336 A1* | 12/2008 | Kim | G11C 29/02 |
| | | | 365/189.11 |
| 2009/0055695 A1* | 2/2009 | Maddali | G01R 31/3187 |
| | | | 714/724 |
| 2010/0077268 A1 | 3/2010 | Lee | |
| 2011/0066798 A1 | 3/2011 | Kaiwa | |
| 2011/0267911 A1 | 11/2011 | Jung | |
| 2017/0062050 A1 | 3/2017 | Baek et al. | |
| 2019/0028102 A1 | 1/2019 | Gans | |
| 2019/0362763 A1 | 11/2019 | Lee et al. | |
| 2020/0059232 A1 | 2/2020 | Johnson | |
| 2021/0149423 A1 | 5/2021 | He et al. | |
| 2021/0383844 A1 | 12/2021 | Antonyan | |
| 2021/0391028 A1 | 12/2021 | Lee | |

FOREIGN PATENT DOCUMENTS

| | | | | |
|---|---|---|---|---|
| CN | 110534140 A | | 12/2019 | |
| CN | 111161783 A | * | 5/2020 | ......... G11C 11/4076 |
| CN | 111933205 A | | 11/2020 | |
| CN | 112204665 A | | 1/2021 | |
| CN | 112669894 A | | 4/2021 | |
| CN | 112908398 A | | 6/2021 | |
| CN | 113421598 A | | 9/2021 | |
| CN | 113539344 A | | 10/2021 | |
| KR | 20080107760 A | | 12/2008 | |

* cited by examiner

CIRCUIT FOR CONTROLLING CALIBRATION, ELECTRONIC DEVICE, AND METHOD FOR CONTROLLING CALIBRATION

CROSS-REFERENCE TO RELATED APPLICATIONS

This is a continuation of International Application No. PCT/CN2022/099870 filed on Jun. 20, 2022, which claims priority to Chinese Patent Application No. 202210475104.2 filed on Apr. 29, 2022. The disclosures of the above-referenced applications are hereby incorporated by reference in their entirety.

BACKGROUND

In a Dynamic Random Access Memory (DRAM), there are output drive circuit and termination resistor circuit, which are used to implement the signal transmission process. In the working process of DRAM, it is needed to calibrate the relevant resistance values of the output drive circuit and the termination resistor circuit, so as to match the actual working conditions (such as voltage and temperature). The above process is called ZQ calibration.

SUMMARY OF THE INVENTION

The present disclosure relates to the field of semiconductor memory technology, in particular to a circuit for controlling calibration, an electronic device and a method for controlling calibration.

The present disclosure provides a circuit for controlling calibration, an electronic device and a method for controlling calibration, which can reduce power consumption of ZQ calibration process and save resources of the memory.

The technical solutions of the present disclosure are as follows.

In a first aspect, the embodiments of the present disclosure provide a circuit for controlling calibration, which is applicable for a memory. The circuit for controlling calibration includes a process circuit, an off-chip calibration circuit and a mode switching circuit.

The process circuit is configured to perform, in a first test mode, a process corner test on the memory to obtain a test result signal. The test result signal is used for determining a process corner parameter. The off-chip calibration circuit is configured to receive and store a first calibration code sent by a user. The first calibration code is determined by the user according to a current environment parameter of the memory and the process corner parameter. The mode switching circuit is configured to receive a calibration mode signal and the first calibration code, and determine the first calibration code as a ZQ calibration code in a case that the calibration mode signal indicates an off-chip calibration mode.

In a second aspect, the embodiments of the present disclosure provide an electronic device including a memory. The memory including a circuit for controlling calibration as described in the first aspect.

In a third aspect, the embodiments of the present disclosure provide a method for controlling calibration. The method is applicable for an electronic device including a memory. The method includes the following operations.

In a first test mode, process corner test is performed on the memory to obtain a test result signal. The test result signal is used for determining a process corner parameter. A first calibration code sent by a user is received after providing the process corner parameter to the user. The first calibration code is determined by the user according to a current environment parameter of the memory and the process corner parameter. A calibration mode signal is received, and in a case that the calibration mode signal indicates an off-chip calibration mode, the first calibration code is determined as a ZQ calibration code.

DETAILED DESCRIPTION

ZQ calibration occupies a certain amount of power consumption and system time, which reduces the performance of memory.

The embodiments of the disclosure provide a circuit for controlling calibration, an electronic device and a method for controlling calibration. With the aid of the process corner parameter, a user can quickly and reasonably determine a first calibration code, and then directly set a ZQ calibration code in an off-chip calibration mode, thereby not only reducing power consumption but also saving system time.

The technical solutions in the embodiments of the present disclosure will be clearly and completely described below in conjunction with the accompanying drawings in the embodiments of the present disclosure. It should be understood that the specific embodiments described herein are intended only to explain the relevant application and not to limit the present disclosure. In addition, it should be noted that for ease of description, only portions related to the application are shown in the accompanying drawings.

Unless otherwise defined, all technical and scientific terms used herein have the same meanings as are commonly understood by those skilled in the art of the present disclosure. The terms used herein are for the purpose of describing embodiments of the present disclosure only and are not intended to limit the present disclosure.

In the following description, reference is made to "some embodiments" that describe a subset of all possible embodiments, but it is understood that "some embodiments" may be the same subset or different subsets of all possible embodiments and may be combined with each other without conflict.

It should be pointed out that, the term "first\second\third" referred to in embodiments of the present disclosure is used only to distinguish similar objects, without representing a particular ordering of objects. It is understood that "first\second\third" may be interchanged in a particular order or priority order where permitted, so that the embodiments of the present disclosure described herein can be implemented in an order other than that illustrated or described herein.

The following is an explanation of the technical terms involved in the embodiments of the present disclosure and the corresponding relationship of some nouns: Low Power Double Data Rate SDRAM (LPDDR), Joint Electron Device Engineering Council (JEDEC).

With the development of technology, the data processing frequency of memory (such as LPDDR) is getting higher and higher. It is very important to maintain signal integrity during the process of data transmission. For example, LPDDR has ZQ pin (BALL), which is externally connected with a standard resistor of 240Ω, which is used to calibrate the output impedance of data signal DQ and the termination impedance of command address signal CA to implement impedance match during the process of signal transmission. The above impedance calibration process is also called ZQ calibration.

At present, in the working process of LPDDR, ZQ self-calibration process needs to be performed frequently according to the external conditions of the memory. However, if the external conditions are constant, for example, voltage and temperature are constant, the ZQ calibration code obtained by the same chip after each time of ZQ calibration is roughly the same, or the lowest bit of the ZQ calibration code will change slightly due to noise, but it is also within the error range. However, each time of ZQ self-calibration process consumes a part of power consumption, takes up a certain calibration time, results in a waste of memory resources. In addition, if the voltage noise of the system is relatively large, the ZQ calibration code may be affected by the voltage noise and introduce a large deviation, and accordingly, the signal integrity of the memory will be degraded due to impedance mismatch.

Based on this, the embodiments of the present disclosure provide a circuit for controlling calibration. With the aid of process corner parameter, a user can quickly and reasonably determine a first calibration code, and then directly set a ZQ calibration code in an off-chip calibration mode, thereby not only reducing power consumption but also saving system time.

Embodiments of the present disclosure will be described in detail below with reference to the accompanying drawings.

In some embodiments of the present disclosure, a method for controlling calibration is provided. The method includes the following operations.

In operation S1, a calibration mode signal is received.

In operation S2, in a case that the calibration mode signal indicates an off-chip calibration mode, the first calibration code sent by the user is determined as the ZQ calibration code.

In operation S3, in a case that the calibration mode signal indicates the on-chip calibration mode, the memory is controlled to perform ZQ self-calibration process to obtain the second calibration code adapted to the current environment parameter, and the second calibration code is determined as the ZQ calibration code.

There is no sequence between operation S2 and operation S3.

It should be noted that the method for controlling calibration provided by the embodiments of the present disclosure is applicable for a memory, and the memory supports an on-chip calibration mode and an off-chip calibration mode, so that a user can send a calibration mode signal to select a required ZQ calibration mode to match different practical application scenarios.

It should be noted that in the off-chip calibration mode, the first calibration code sent by the user is used as the ZQ calibration code to implement the impedance calibration of the memory. In the on-chip calibration mode, the second calibration code obtained after ZQ self-calibration process is used as the ZQ calibration code to implement the impedance calibration of the memory. It should be understood that the ZQ calibration code is subsequently used to be written into the input impedance circuit and the termination resistor circuit to calibrate the output impedance of the data signal DQ and the termination impedance of the command address signal CA to desired values.

In this way, the user is allowed to select the on-chip calibration mode or the off-chip calibration mode to determine the ZQ calibration code, which achieves the best performance in different practical application scenarios. Under the condition of constant external conditions, the user may set ZQ calibration code through off-chip calibration mode without frequent ZQ self-calibration process, which not only reduces power consumption but also saves system time, thereby reducing resource waste and improving data process performance of memory. In addition, the off-chip calibration mode can also avoid the deviation introduced by environment noise to ZQ calibration code, and avoid the signal integrity degradation of memory caused by impedance mismatch.

Figure 1:
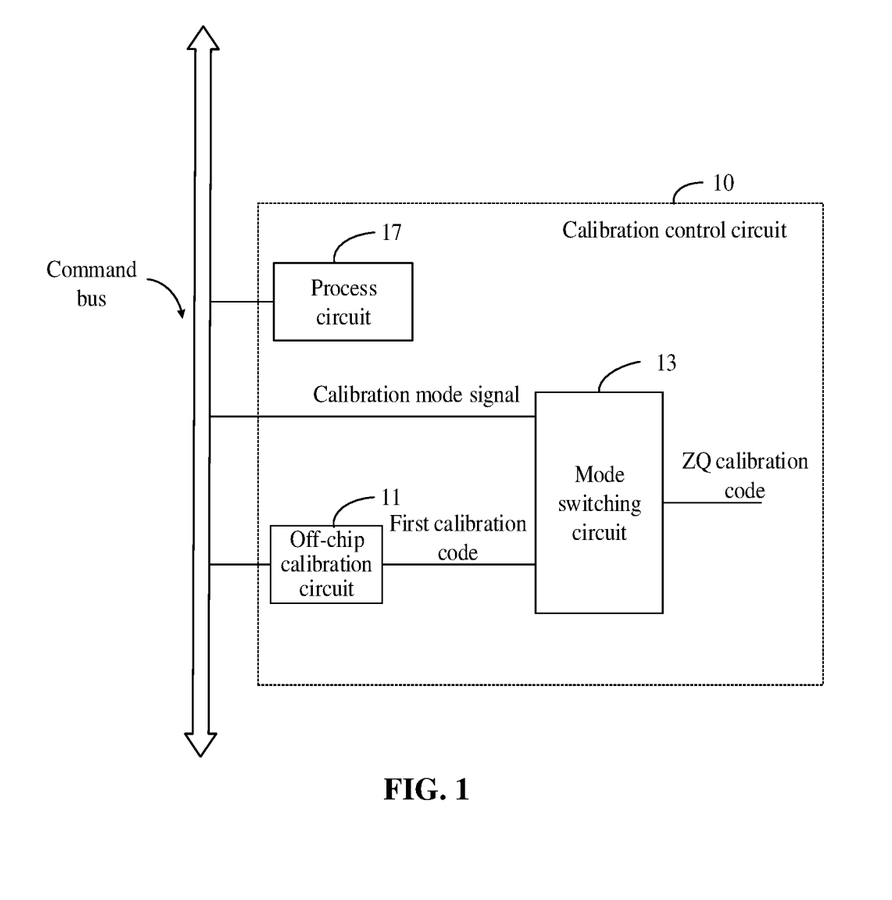
FIG. 1 is a schematic diagram of a structure of a circuit for controlling calibration provided by the embodiments of the present disclosure.

In an embodiment of the present disclosure, referring to FIG. 1, a schematic diagram of the composition structure of a circuit for controlling calibration 10 provided by the embodiments of the present disclosure is shown. As shown in FIG. 1, the circuit for controlling calibration 10 may include a process circuit 17, an off-chip calibration circuit 11 and a mode switching circuit 13.

The process circuit 17 is configured to perform, in a first test mode, a process corner test on the memory to obtain a test result signal. The test result signal is used for determining a process corner parameter.

The off-chip calibration circuit 11 is configured to receive and store a first calibration code sent by a user. The first calibration code is determined by the user according to a current environment parameter of the memory and the process corner parameter.

The mode switching circuit 13 is configured to receive a calibration mode signal and the first calibration code, and determine the first calibration code as a ZQ calibration code in a case that the calibration mode signal indicates an off-chip calibration mode.

It should be noted that the circuit for controlling calibration 10 of the embodiments of the present disclosure is applicable for various types of memories. For example, the memory may be LPDDR4, LPDDR5, DDR4, DDR5, etc.

As shown in FIG. 1, the process circuit 17, the off-chip calibration circuit 11 and the mode switching circuit 13 are all connected with a command bus. Specifically, the process circuit 17 receives a control instruction from the command bus, performs process corner test on the memory according to the control instruction, and outputs the test result signal via the command bus, which is subsequently used to determine the process corner parameter. The off-chip calibration circuit 11 receives the first calibration code from the command bus and sends the first calibration code to the mode switching circuit 13. The mode switching circuit 13 receives a calibration mode signal from the command bus and determines the first calibration code as the ZQ calibration code in a case that the calibration mode signal indicates the off-chip calibration mode.

Herein, the process corner parameter can be used to measure the effective working conditions of the memory, and the memories produced in different batches have slight differences. Based on the process corner parameter of the memory and the current environment parameter of the memory, the user can quickly and accurately determine the first calibration code.

That is to say, in the embodiments of the present disclosure, it is convenient for the user to reasonably determine the first calibration code by providing the process corner parameter of the memory to the user. At the same time, the memory provides the off-chip calibration mode allowing users to directly define ZQ calibration code, which not only reduces power consumption but also saves system time, thereby reducing resource waste, improving data process performance of the memory, avoiding the deviation introduced to ZQ calibration code by environment noise, and avoiding the signal integrity degradation of the memory caused by impedance mismatch.

Figure 2:
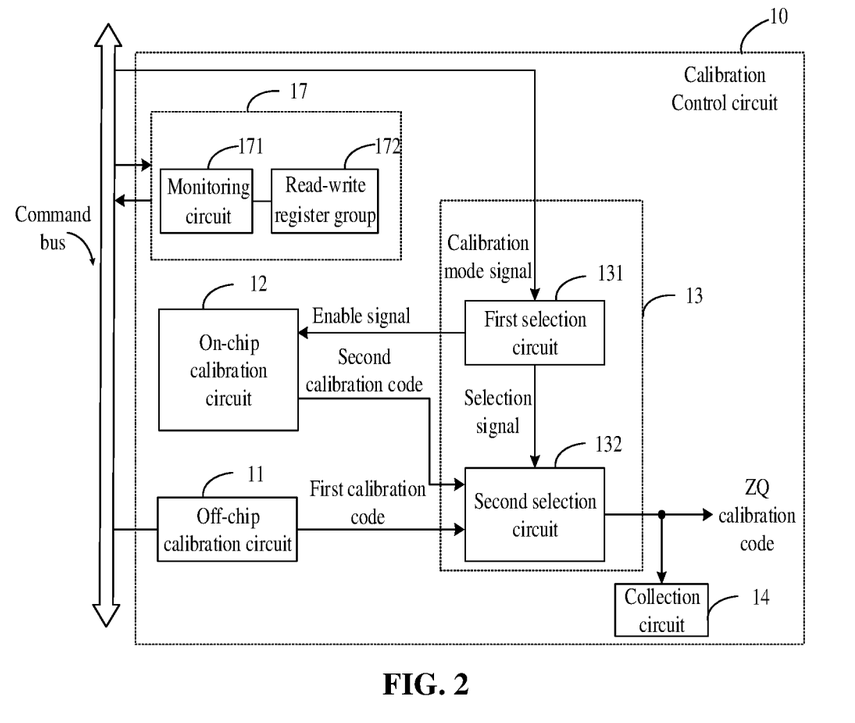
FIG. 2 is a schematic diagram of a structure of another circuit for controlling calibration provided by the embodiments of the present disclosure.

In some embodiments, as shown in FIG. 2, the process circuit 17 may include a monitoring circuit 171 and a read-write register group 172.

The read-write register group 172 is configured to: in the first test mode, receive a write instruction including a starting time and a closing time and store the starting time and the closing time.

The monitoring circuit 171 is configured to perform, in the first test mode, the process corner test on the memory based on the starting time and the closing time to obtain the test result signal.

The read-write register group 172 is further configured to collect and store the test result signal, and output the test result signal in a case that a first read instruction is received.

It should be noted that the monitoring circuit 171 is configured to perform the process corner test on the memory at a predetermined temperature, a predetermined voltage and a predetermined time interval. The essence of the monitoring circuit 171 may be a Ring Oscillator. The read-write register group 172 is configured to receive test related parameters, such as the starting time of the Ring Oscillator and the closing time of the Ring Oscillator, and collecting and outputting the test result signal (for example, the count value of the Ring Oscillator, i.e., the test result signal). Subsequently, the process corner parameter may be obtained by analyzing the test result signal, and the specific analysis process may be performed automatically or manually.

In some embodiments, a process corner parameter is used for determining a target coefficient value from a plurality of preset coefficient values. The preset coefficient values are used for indicating the relationships between the first calibration code and the environment parameters, and different preset coefficient values have corresponding relationships with different process corner parameters. In the working process of the memory, the user calculates and obtains the first calibration code based on the target coefficient value, the current environment parameter and the calibration code basic value. The calibration code basic value refers to the value of the first calibration code under the standard environment parameter.

It should be noted that the preset coefficient value may be provided to the user by the electronic device where the memory is located, or be stored by the user himself The standard voltage parameter and standard temperature parameter may be valued according to practical application scenarios. Exemplarily, the standard voltage parameter is equal to 0.6 V and the standard temperature parameter is equal to 25° C.

In one specific embodiment, each environment parameter and each preset coefficient value include a sub-parameter respectively. At this time, the user can calculate the first calibration code in the following manner: the first calibration code=calibration code basic value+target coefficient value× (current environment parameter−standard environment parameter).

In another one specific embodiment, each environment parameter and each preset coefficient value include a plurality of sub-parameters respectively. For example, each environment parameter includes a voltage parameter and a temperature parameter, and the target coefficient value includes a voltage coefficient and a temperature coefficient accordingly. At this time, the user calculates the first calibration code in the following manner: the first calibration code=calibration code basic value+voltage coefficient×(current voltage parameter−standard voltage parameter)+temperature coefficient×(current temperature parameter−standard temperature parameter).

In other embodiments, the process corner parameter is used for selecting a target parameter table from a plurality of preset parameter tables. The preset parameter table is used for indicating the mapping relationships between different environment parameters and different values of the first calibration code, and the different preset parameter tables have corresponding relationships with different process corner parameters. In the working process of the memory, the user uses the target parameter table to determine the first calibration code corresponding to the current environment parameter.

It should be noted that the preset parameter table may be provided to the user by the electronic device where the memory is located, or be stored by the user himself.

In this way, the target parameter table can be directly determined according to the process corner parameter, and then the required first calibration code can be selected from the target parameter table by using the current environment parameter, which reduces the calculation process and is convenient for users to use.

In some embodiments, as shown in FIG. 2, the circuit for controlling calibration 10 may further include an on-chip calibration circuit 12.

The on-chip calibration circuit 12 is configured to receive an enable signal, and in a case that the enable signal is in an active state, perform ZQ self-calibration process on the memory to obtain a second calibration code adapted to the current environment parameter.

The mode switching circuit 13 is further configured to receive the second calibration code, and determine the second calibration code as the ZQ calibration code in a case that the calibration mode signal indicates an on-chip calibration mode.

It should be noted that the on-chip calibration circuit 12 is externally connected with a standard resistor (the resistance value is 240Ω), and can perform ZQ self-calibration process based on the standard resistor, and calibrate the output impedance and the termination impedance of the memory to the standard resistance value. ZQ self-calibration process refers to the automatic on-chip ZQ calibration under the condition of certain temperature, voltage and time variation. The elaboration is shown in the relevant regulations of JEDEC.

Thus, in embodiments of the present disclosure, the user is allowed to select the on-chip calibration mode or the off-chip calibration mode to determine the ZQ calibration code, which achieves the best performance in different practical application scenarios. Under the condition of constant external conditions, users can directly set ZQ calibration code through off-chip calibration mode without frequent ZQ self-calibration process, which not only reduces power consumption but also saves system time, thereby reducing resource waste and improving data process performance of memory. In addition, the off-chip calibration mode can also avoid the deviation introduced by environment noise to ZQ calibration code, and avoid the signal integrity degradation of memory caused by impedance mismatch.

As shown in FIG. 2, in some embodiments, the mode switching circuit 13 may include a first selection circuit 131 and a second selection circuit 132.

The first selection circuit 131 is configured to receive the calibration mode signal, output a selection signal in a first state and an enable signal in an inactive state in a case that the calibration mode signal indicates the off-chip calibration mode, or, output the selection signal in a second state and the enable signal in the active state in a case that the calibration mode signal indicates the on-chip calibration mode.

The second selection circuit 132 is configured to receive the selection signal, output the first calibration code as the ZQ calibration code in a case that the selection signal is in the first state, or, output the second calibration code as the ZQ calibration code in a case that the selection signal is in the second state.

It should be understood that the first state and the second state refer to different logic level states, but their specific values may be determined according to practical application scenarios. For example, the first state may be a high level signal and the second state may be a low level signal, or, the first state may be a low level signal and the second state may be a high level signal. Similarly, the active state and the inactive state refer to different logic level states, and their specific values may also be determined according to practical application scenarios, which is not limited in the embodiments of the present disclosure.

Figure 3:
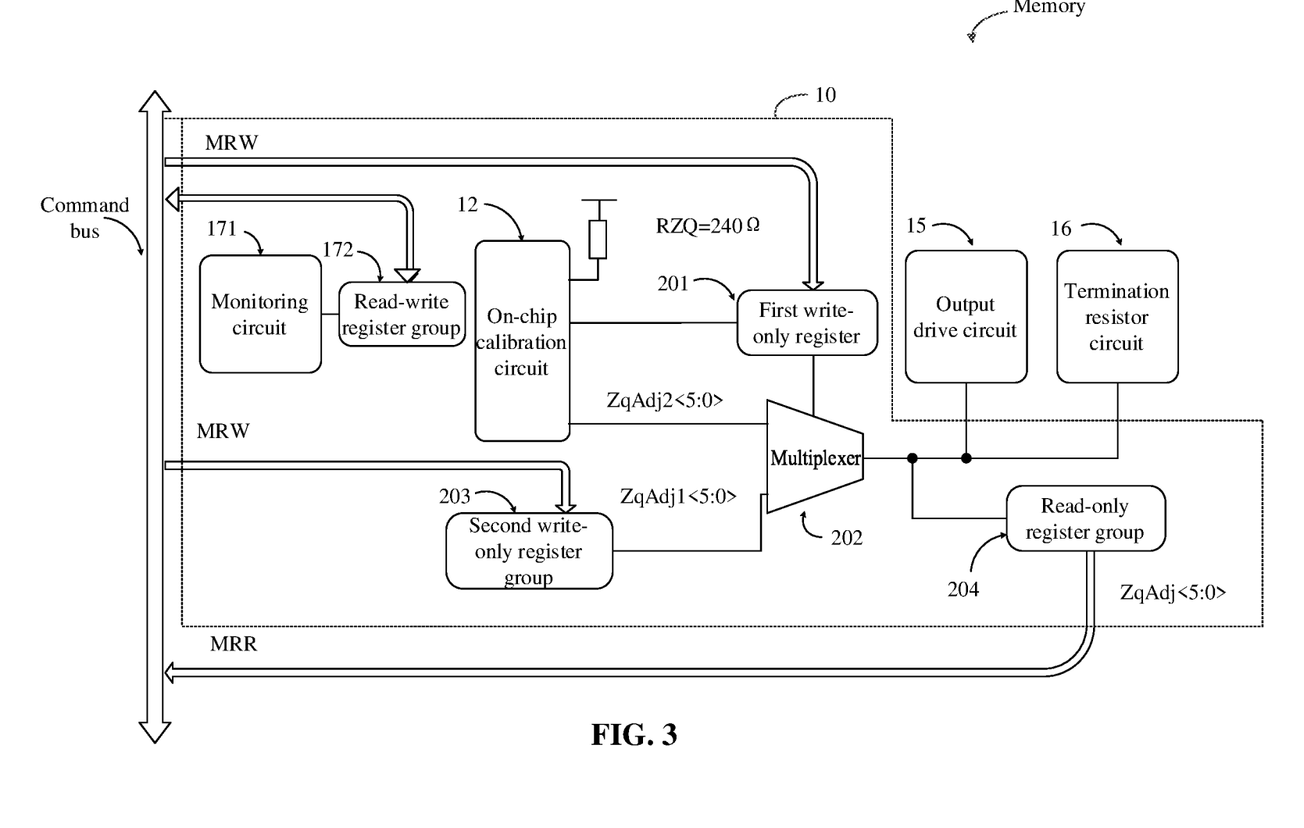
FIG. 3 is a schematic diagram of an application scenario of a circuit for controlling calibration provided by the embodiments of the present disclosure.

Referring to FIG. 3, a schematic diagram of an application scenario of a circuit for controlling calibration 10 provided by the embodiments of the present disclosure is shown. As can be seen from FIG. 2 and FIG. 3, in some embodiments, the first selection circuit 131 includes a first write-only register 201, the second selection circuit 132 includes a multiplexer 202, and the off-chip calibration circuit 11 includes a second write-only register group 203.

An input end of the first write-only register 201 is configured to receive the calibration mode signal, and an input end of the second write-only register group 203 is configured to receive the first calibration code ZqAdj1<5: 0>.

An enable end of the on-chip calibration circuit 12 is connected with a first output end of the first write-only register 201 to receive the enable signal.

A control end of the multiplexer 202 is connected with a second output end of the first write-only register 201 to receive the selection signal. A first input end of the multiplexer 202 is connected with an output end of the on-chip calibration circuit 12 to receive the second calibration code ZqAdj2<5:0>. A second input end of the multiplexer 202 is connected with an output end of the second write-only register group 203 to receive the first calibration code ZqAdj1<5:0>. An output end of the multiplexer 202 is configured to output the ZQ calibration code ZqAdj <5:0>.

It should be noted that the first write-only register 201 may store only one bit of data. The different numerical states (0 or 1) of the data indicate the on-chip calibration mode or the off-chip calibration mode, respectively, which depends on the practical application scenario specifically. The second write-only register group 203 needs to store multiple bits of data, which depends on the number of bits of the ZQ calibration code specifically. Exemplarily, the ZQ calibration code may include 6 bits of data, which is denoted <5:0>.

In addition, the input end of the first write-only register 201 and the input end of the second write-only register group 203 are both connected with the command bus, thereby implementing related data transmission. Specifically, the user sends the calibration mode signal to the first write-only register 201 in the form of a write instruction MRW to enable the on-chip calibration mode or the off-chip calibration mode. The user sends the first calibration code to the second write-only register group 203 in the form of the write instruction MRW. The first calibration code is subsequently used to set the ZQ calibration code.

It should be understood that before switching from the on-chip calibration mode to the off-chip calibration mode, the user should first send the first calibration code to avoid a blank interval of the ZQ calibration code after the on-chip calibration mode is switched to the off-chip calibration mode. That is, if the user directly switches the on-chip calibration mode to the off-chip calibration mode without sending the first calibration code firstly, there may be no data or inappropriate data (for example, the data of the off-chip calibration mode in last time) in the second write-only register group 203, thereby resulting in an impedance mismatch of the memory, and thus a signal error is caused.

It should be noted that the circuit structure shown in FIG. 3 is not the only choice due to the diversity of circuit elements. Exemplarily, the first write-only register 201 may have only one output end, and if the inactive state of the enable signal is the same as the first state of the calibration mode signal, both the input end of the first write-only register 201 and the enable end of the on-chip calibration circuit 12 may be connected with the unique output end of the first write-only register 201. If the inactive state of the enable signal is different from the first state of the calibration mode signal, the associated logic may be implemented by means of an inverter.

In some embodiments, as shown in FIG. 2, the circuit for controlling calibration 10 may further include a collection circuit 14. An input end the collection circuit 14 is connected with the output end of the mode switching circuit 13.

The on-chip calibration circuit 12 is further configured to perform, in the second test mode, ZQ self-calibration process on the memory for a standard environment parameter to obtain a calibration code basic value.

The mode switching circuit 13 is further configured to receive, in the second test mode, the calibration mode signal indicating the on-chip calibration mode to output the calibration code basic value.

The collection circuit 14 is configured to collect the calibration code basic value, and the calibration code basic value is used for determining the first calibration code.

It should be noted that the embodiments of the present disclosure implements the result output of ZQ self-calibration process through the collection circuit 14, so as to obtain the calibration code basic value. Specifically, in the second test mode, the calibration mode signal fixedly indicates the on-chip calibration mode, so as to perform self-calibration process on the memory under the standard environment parameter to obtain the calibration code basic value.

In the case that each environment parameter includes a voltage parameter and a temperature parameter, taking the system composed of memory and memory controller as an example, the second test mode may be entered in a fixed stage of system initialization, the memory controller is used to adjust the memory to be in the environment of standard voltage parameter and standard temperature parameter, and then the memory is controlled to perform ZQ self-calibration process. The calibration result is output through the collection circuit 14 to obtain the calibration code basic value. In addition, the system may also include a temperature control device. After entering the second test mode, the voltage of the memory is adjusted by the memory controller, and the temperature of the memory is adjusted by the temperature control device.

In some embodiments, as can be seen in conjunction with FIG. 2 and FIG. 3, the collection circuit 14 includes a read-only register group 204. An input end of the read-only register group 204 is connected with the output end of the multiplexer 202.

The read-only register group 204 is configured to collect an output signal of the multiplexer 202.

The read-only register group 204 is further configured to, in a second test mode, receive a second read instruction and output the calibration code basic value according to the second read instruction.

It should be noted that the read-only register group 204 needs to store multiple bits of data, which depends on the number of bits of the ZQ calibration code specifically. That is, the number of bits of data stored in the second write-only register group 203 is the same as that of data stored in the read-only register group 204. In addition, the input end of the read-only register group 204 and the output end of the read-only register group 204 are also connected with the command bus. After receiving the read instruction MRR from the command bus, the read-only register group 204 outputs the calibration code basic value.

In this way, the calibration result of the on-chip calibration circuit 12 may be output by means of the read-only register group 204, so that the user may obtain the calibration code basic value, and then the appropriate first calibration code may be determined in combination with the process corner parameter and the current environment parameter of the memory.

In some embodiments, as shown in FIG. 3, the memory further includes an output drive circuit 15 and a termination resistor circuit 16. The memory is further configured to write the ZQ calibration code into the output drive circuit 15 and the termination resistor circuit 16 to implement resistance calibration process of the output drive circuit 15 and the termination resistor circuit 16.

As can be seen from the above, firstly, two register groups are added in the embodiments of the present disclosure, namely, the second write-only register group 203 and the read-only register group 204. A user sends the write instruction MRW to write the first calibration code into the second write-only register group 203, and a user sends a read instruction MRR to read out the calibration code basic value from the read-only register group 204. Secondly, first write-only register 201 (which may also be a programmable fuse Efuse register that is solidified before the memory leaves the factory) is added in the embodiments of the present disclosure. The user writes the calibration mode signal into the first write-only register 201 through the write instruction MRW, and controls whether the ZQ calibration code is output by the on-chip calibration circuit 12 or the off-chip calibration circuit 11. Then, the read-write register group 172 is further added in the embodiments of the present disclosure. The write register section of the read-write register group 172 receives the starting time and the closing time sent by the user through the write instruction, thereby controlling the monitoring circuit 171 to perform the process corner test according to the starting time and the closing time. A read register section of the read-write register group 206 is configured to store a count value (test result signal) of the monitoring circuit 171, and the data is read out by a read instruction MRR sent by user. For the monitoring circuit 207, the count value obtained in the first test mode (specified voltage, specified temperature, and specified test time interval) may be used to determine the process corner parameter for the user to determine the first calibration code. In this way, not only the control circuit of dual selection of on-chip and off-chip of ZQ calibration is implemented, but also the user can quickly and reasonably determine the first calibration code.

In the above method, the user determines the first calibration code based on the process corner parameter in combination with the current environment parameter. In addition, other means may be provided to assist the user in determining the first calibration code. For example, for the memory, mapping relationships among a plurality of candidate calibration codes and a plurality of environment parameters are established in advance, and a user may directly select and obtain a first calibration code from a plurality of candidate calibration codes according to the current environment parameter.

Therefore, in some embodiments, the on-chip calibration circuit 12 is further configured to perform, in the second test mode, ZQ self-calibration process for multiple times on the memory for a plurality of environment parameters to obtain a plurality of candidate calibration codes. The mode switching circuit 13 is further configured to receive, in a second test mode, the calibration mode signal indicating the on-chip calibration mode to output a plurality of candidate calibration codes. The collection circuit 14 is configured to collect the plurality of candidate calibration codes to establish preset mapping relationships, and the preset mapping relationships refer to relationships among a plurality of environment parameters and a plurality of candidate calibration codes.

It should be noted that the embodiments of the present disclosure implement the result output of ZQ self-calibration process through the collection circuit 14, so that users can know the relevant values of ZQ calibration codes.

In this way, during the working process of the memory, the user may also determine the corresponding first calibration code by using the current environment parameter and the preset mapping relationship, and even in the off-chip calibration mode, the accuracy of ZQ calibration can be ensured.

In a specific embodiment, it is assumed that the environment parameter include the temperature parameter and the voltage parameter. The working process of the above circuit for controlling calibration 10 is described in detail by taking a system composed of a memory controller and a memory as an example.

Firstly, after the memory is produced, the process corner test is performed by the process circuit 17 to obtain the process corner parameter of the memory.

Secondly, at a certain stage of system initialization, the memory controller controls the memory to enter the second test mode. At this time, the calibration mode signal indicates the on-chip calibration mode, the memory is controlled to be in the environment of standard voltage parameter and standard temperature parameter, and on-chip ZQ self-calibration process is performed once by using the on-chip calibration circuit 12. After the ZQ self-calibration process is completed, the calibration code basic value is read out through the read-only register group 204, and the calibration code basic value is provided to the user. In particular, the user can also know the target coefficient values (including voltage coefficients and temperature coefficients) corresponding to different process corner parameters.

Finally, in the working process of the system, the current voltage parameter is determined by the Power Management Unit (PMU) in the system, and the current temperature parameter is determined by a temperature sensor. The first calibration code may be determined based on the current voltage parameter and the current temperature parameter by using the following formula: first calibration code=calibration code basic value+voltage coefficient×(current voltage parameter−standard voltage parameter)+temperature coefficient×(current temperature parameter−standard temperature parameter). After writing the first calibration code into the second write-only register group 203, the memory is controlled to switch to the off-chip calibration mode by sending the calibration mode signal, and then the first calibration code is written into a driver (output drive circuit 15) and a CA ODT (termination resistor circuit 16) of each DQ by using a ZQ Latch command, and simultaneously on-chip ZQ self-calibration process is prohibited. Thus, the purpose of saving electricity can be achieved, and the on-chip ZQ self-calibration deviation caused by environment noise can be avoided.

In another specific embodiment, in order to simplify the operation, the user may also directly obtain a preset parameter table corresponding to different process corner parameters. The preset parameter table describes candidate calibration codes corresponding to different temperatures and different voltages under the specified process corner parameter. A specific preset parameter table may be shown in Table 1. Thus, in the working process of the system, the target parameter table may be selected from a plurality of preset parameter tables according to the process corner parameter of the memory, and then the first calibration code may be directly selected from the target parameter table based on the current voltage parameter and the current temperature parameter, thereby improving the accuracy of the first calibration code and simplifying the calculation process.

It should be understood that the various parameters and calibration code values in Table 1 are examples and do not constitute relevant limitations. In addition, the temperature parameter refers to the current temperature of the memory, and the voltage parameter refers to the power supply voltage used by the output drive circuit and the termination circuit of the memory.

On the basis of above, the determination of the first calibration code may also not involve the process corner parameter. For example, at a certain stage of system initialization, the memory controller controls the memory to enter the second test mode, at which time the calibration mode signal indicates the on-chip calibration mode. The combination of temperature and voltage is scanned by the memory controller, one case of combination is scanned for each time, and on-chip ZQ self-calibration process is performed once by the on-chip calibration circuit 12. After the ZQ self-calibration process is completed, the values of the candidate calibration codes are read out through the read-only register group 204, and these values are recorded by the System on Chip (SOC) of user. After all the combination scans are completed, the user obtains a comparison table of temperature parameters, voltage parameters and candidate calibration codes, which may also be seen in the above Table 1. That is, the system needs to perform test on the memory, so as to directly determine the target parameter table corresponding to the memory, instead of the user selecting the target parameter table from a plurality of preset parameter tables according to the process corner parameter. In this way, in the working process of the system, after determining the current voltage parameter and the current temperature parameter, the first calibration code may also be directly determined according to the target parameter table.

In contrast, when determining the first calibration code by using process corner parameter, only one time of ZQ calibration process is needed to be performed for standard environment parameter during system initialization, and ZQ calibration process is not needed to be performed for different environment parameters respectively, thus saving a lot of time and resources.

In addition, the circuit for controlling calibration 10 provided by the embodiments of the present disclosure may be compatible with the conventional ZQ calibration mode. That is, the memory may be controlled to be in the on-chip calibration mode during the normal use of the user. At this time, the on-chip calibration circuit 12 performs on-chip ZQ self-calibration process on the memory under condition of certain temperature, voltage and time variation in accordance with JEDEC regulations. After the calibration is

TABLE 1

|  | voltage parameter = 0.4 V | voltage parameter = 0.45 V | voltage parameter = 0.5 V | voltage parameter = 0.55 V | voltage parameter = 0.60 V |
| --- | --- | --- | --- | --- | --- |
| temperature parameter = −40° C. | 001110 | 000110 | 000010 | 000001 | 000000 |
| temperature parameter = 0° C. | 010100 | 001100 | 001000 | 000101 | 000100 |
| temperature parameter = 25° C. | 101100 | 100100 | 100000 | 010110 | 010100 |
| temperature parameter = 85° C. | 110100 | 101100 | 101000 | 100010 | 100000 |
| temperature parameter = 105° C. | 111100 | 110100 | 110000 | 100100 | 100000 |
| temperature parameter = 125° C. | 111111 | 111100 | 111000 | 110100 | 100100 | completed, the second calibration code is written into the driver (output drive circuit 15) and CA ODT (termination resistor circuit 16) of each DQ by using ZQ Latch command.

In other words, in order to overcome the disadvantage that the user cannot know or set the ZQ calibration code, the embodiments of the present disclosure provide a circuit for controlling calibration 10. The circuit for controlling calibration 10 at least includes the following contents. On the one hand, the ZQ calibration code is controlled by a multiplexer to adopt the first calibration code (an off-chip value set by the user) or the second calibration code (an on-chip value obtained by ZQ self-calibration), so as to be suitable for different application scenarios. On the other hand, the read-only register group and the second write-only register group are added to facilitate the user to read out the candidate calibration code and write the first calibration code. In another aspect, the first write-only register is added, so that the user can select the on-chip calibration mode or the off-chip calibration mode, thereby implementing the mode switching quickly and conveniently. In yet another aspect, the process circuit is added, so that the user can know the process corner parameter of the memory and can accurately determine the first calibration code.

To sum up, the embodiments of the present disclosure provide a circuit for controlling calibration. In an off-chip calibration mode, a user is allowed to directly send a first calibration code to determine the ZQ calibration code without frequent ZQ self-calibration process, which not only reduces power consumption but also saves system time, thereby reducing resource waste and improving data process performance of a memory. In addition, with the aid of process corner parameter, the user can quickly and reasonably determine the first calibration code, thereby further reducing power consumption and time consumption.

Figure 4:
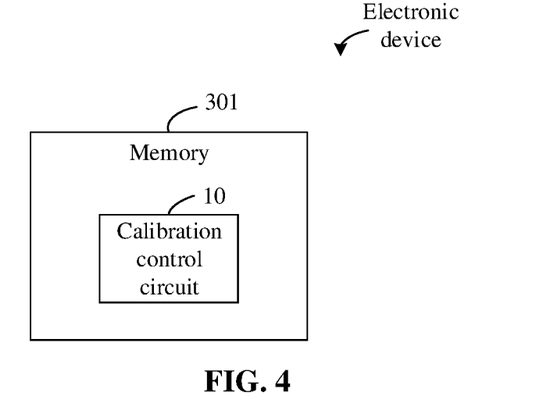
FIG. 4 is a schematic diagram of a structure of an electronic device provided by the embodiments of the present disclosure.

In another embodiment of the present disclosure, referring to FIG. 4, a schematic diagram of the composition structure of an electronic device provided by the embodiments of the present disclosure is shown. As shown in FIG. 4, the electronic device includes a memory 301 and the memory 301 includes the above circuit for controlling calibration 10.

Since there is the circuit for controlling calibration 10 in the electronic device, in an off-chip calibration mode, a user is allowed to directly send a first calibration code to determine a ZQ calibration code without frequent ZQ self-calibration process, which not only reduces power consumption but also saves system time, thereby reducing resource waste and improving data process performance of a memory. In addition, with the aid of process corner parameter, the user can quickly and reasonably determine the first calibration code, thereby further reducing power consumption and time consumption.

Figure 5:
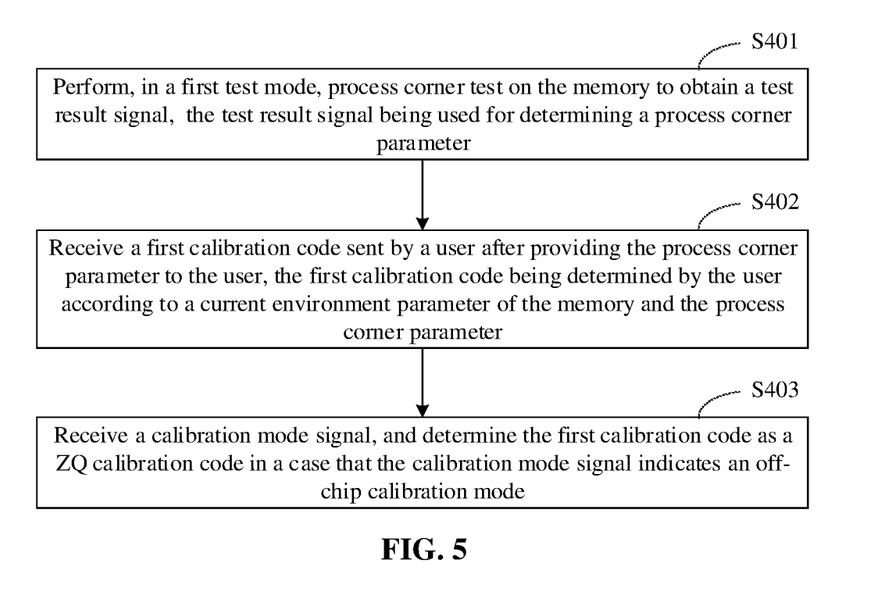
FIG. 5 is a flow diagram of a method for controlling calibration provided by the embodiments of the present disclosure.

In yet another embodiment of the present disclosure, referring to FIG. 5, a flow diagram of a method for controlling calibration provided by the embodiments of the present disclosure is shown. As shown in FIG. 5, the method may include the following operations.

In step S401, in a first test mode, process corner test is performed on the memory to obtain a test result signal. The test result signal is used for determining a process corner parameter.

It should be noted that the method for controlling calibration provided by the embodiments of the present disclosure is applicable for the above electronic device including the memory 301. The memory 301 includes at least the circuit for controlling calibration 10. According to the above contents, the memory 301 supports at least the on-chip calibration mode and the off-chip calibration mode.

It should be noted that the process corner parameter may measure the effective working conditions of the memory, and the memories produced in different batches have slight differences. The process corner parameter of the memory can subsequently assist the user to determine the first calibration code, and then in the off-chip calibration mode, the ZQ calibration code is directly set.

In step S402, a first calibration code sent by a user is received after providing the process corner parameter to the user. The first calibration code is determined by the user according to a current environment parameter of the memory and the process corner parameter.

In step S403, a calibration mode signal is received, and in a case that the calibration mode signal indicates an off-chip calibration mode, the first calibration code is determined as a ZQ calibration code.

Here, the step S402 may be performed repeatedly after step S403. In other words, the user may continue to send a new first calibration code to the electronic device after step S403.

In this way, the user can quickly and reasonably determine the first calibration code by using the current environment parameter and process corner parameter of the memory, and then directly set the ZQ calibration code by means of the off-chip calibration mode, thus reducing power consumption and saving system time.

In some embodiments, when the calibration mode signal indicates an on-chip calibration mode, the memory is controlled to perform ZQ self-calibration process to obtain a second calibration code, and the second calibration code is determined as the ZQ calibration code.

Thus, in the off-chip calibration mode, the first calibration code sent by the user is used as the ZQ calibration code to implement the impedance calibration of the memory. In the on-chip calibration mode, the second calibration code obtained after ZQ self-calibration process is used as the ZQ calibration code to implement the impedance calibration of the memory.

In some embodiments, in a case that the calibration mode signal indicates an off-chip calibration mode, the method may further include the following operations.

An enable signal in an inactive state and a selection signal in a first state are determined according to the calibration mode signal. The memory is controlled to stop ZQ self-calibration process by using the enable signal in the inactive state. The first calibration code is determined as the ZQ calibration code by using the selection signal in the first state. Alternatively, the enable signal in the active state and the selection signal in the second state are determined according to the calibration mode signal. The memory is controlled to perform ZQ self-calibration process by using the enable signal in the active state. The second calibration code is determined as the ZQ calibration code by using the selection signal in the second state.

It should be noted that the functions and related changes of the enable signal and the selection signal may be understood with reference to the above FIG. 2 and FIG. 3. Thus, two different calibration modes, namely, the on-chip calibration mode and the off-chip calibration mode, are implemented by introducing the enable signal and the selection signal.

In some embodiments, the method further includes the following operations.

The current environment parameter of the memory is detected. The process corner parameter, the current environment parameter and a calibration code basic value are provided to the user. The first calibration code is received.

The first calibration code is calculated and obtained by a target coefficient value, the calibration code basic value and the current environment parameter. Herein, the target coefficient value is selected from a plurality of preset coefficient values based on the process corner parameter, the preset coefficient values are used for indicating relationships between the first calibration code and environment parameters, different preset coefficient values have corresponding relationships with different process corner parameters, and the calibration code basic value refers to a value of the first calibration code under a standard environment parameter.

In some embodiments, in the second test mode, the calibration mode signal is controlled to indicate the on-chip calibration mode. The memory is controlled to perform ZQ self-calibration process based on the standard environment parameter to obtain the calibration code basic value.

Exemplarily, it is assumed that each environment parameter includes a voltage parameter and a temperature parameter. Firstly, in the initialization process of the electronic device, the second test mode may be entered automatically, and the electronic device adjusts the memory to be in the external environment of standard voltage parameter and standard temperature parameter, and controls the memory to perform ZQ self-calibration process to obtain the calibration code basic value. Secondly, in the normal working process of the electronic device, the user may send corresponding control instructions, and the electronic device detects the current environment parameter of the memory. Then, the user determines a target coefficient value from a plurality of preset coefficient values according to the process corner parameter of the memory, and performs calculation for the current environment parameter, the calibration code basic value and the target coefficient value to obtain the first calibration code.

In a specific embodiment, the target coefficient value includes a voltage coefficient and a temperature coefficient, the standard environment parameter includes a standard voltage parameter and a standard temperature parameter, and the current environment parameter includes a current voltage parameter and a current temperature parameter. A difference between the current voltage parameter and the standard voltage parameter is recorded as a voltage change value, and a difference between the current temperature parameter and the standard temperature parameter is recorded as a temperature change value. The first calibration code is obtained by performing summing operation on the calibration code basic value, a product of the voltage change value and the voltage coefficient, and a product of the temperature change value and the temperature coefficient. That is, the first calibration code=calibration code basic value+voltage coefficient×(current voltage parameter−standard voltage parameter)+temperature coefficient×(current temperature parameter−standard temperature parameter).

It should also be noted that a plurality of preset coefficient values may be provided to users by the electronic device, or may be obtained by the user according to the results summarized after performing test and fitting processing on different electronic devices.

Therefore, in some embodiments, a plurality of preset coefficient values are provided to the user by the electronic device.

Alternatively, the method may further include the following operations. In a second test mode, the calibration mode signal is controlled to indicate an on-chip calibration mode. The memory is controlled to perform ZQ self-calibration process for multiple times based on a plurality of environment parameters to obtain a plurality of candidate calibration codes. The plurality of environment parameters and the plurality of candidate calibration codes are fitted to determine the preset coefficient value corresponding to the process corner parameter.

Exemplarily, it is assumed that there are a plurality of memories. The process corner parameters of the memories are represented as process corner parameter 1, process corner parameter 2 . . . , process corner parameter n, respectively. For the memory of the process corner parameter 1, the memory is controlled to enter the second test mode according to the above steps to perform ZQ self-calibration process for multiple times, a plurality of environment parameters and a plurality of candidate calibration codes are obtained, preset coefficient values are obtained by fitting the plurality of environment parameters and a plurality of candidate calibration codes, thereby obtaining a preset coefficient value corresponding to the process corner parameter 1. The above steps are performed repeatedly for the memory of the process corner parameter 2, . . . , the memory of the process corner parameter n respectively to obtain the preset coefficient value corresponding to the process corner parameter 2, . . . , the preset coefficient value corresponding to the process corner parameter n respectively, so as to obtain the preset coefficient values corresponding to different process corner parameters.

In this way, the target coefficient value is selected by the process corner parameter, so that the first calibration code may be calculated and obtained according to the calibration code basic value, the target coefficient value and the current environment parameter.

In some embodiments, in order to reduce the amount of calculation for the user, the user may also be provided with preset parameter tables under different process corners, so that the user directly determines the first calibration code according to the target parameter table. Specifically, the method may include the following operations. The current environment parameter of the memory is detected. The current environment parameter and the process corner parameter are provided to the user. The first calibration code is received. The first calibration code is determined by a target parameter table and the current environment parameter. Herein, the target parameter table is selected from a plurality of preset parameter tables based on the process corner parameter, the preset parameter tables are used for indicating mapping relationships between different environment parameters and different values of the first calibration code, and different preset parameter tables have corresponding relationships with different process corner parameters.

In this way, the target parameter table may be directly determined according to the process corner parameter, and then the required first calibration code may be selected from the target parameter table by using the current environment parameter, which saves the calculation process and is convenient for users to use.

It should be noted that a plurality of preset parameter tables may be provided to the user by the electronic device, or may be obtained by user according to the results summarized after performing test process on different electronic devices.

Therefore, in some embodiments, a plurality of preset parameter tables are provided to the user by the electronic device.

Alternatively, the method may further include the following operations. In a second test mode, the calibration mode signal is controlled to indicate the on-chip calibration mode. The memory is controlled to perform ZQ self-calibration process for multiple times respectively based on a plurality of environment parameters to obtain a plurality of candidate calibration codes. A preset parameter table corresponding to the process corner parameter is determined based on the plurality of environment parameters and the plurality of candidate calibration codes.

Exemplarily, it is assumed that there are a plurality of memories. The process corner parameters of the memories are represented as process corner parameter 1, process corner parameter 2, . . . , process corner parameter n, respectively. For the memory of the process corner parameter 1, the memory is controlled to enter the second test mode according to the above steps to perform ZQ self-calibration process for multiple times, a plurality of environment parameters and a plurality of candidate calibration codes are obtained, and a preset parameter table corresponding to the process corner parameter 1 is formed. The above steps are performed repeatedly for the memory of the process corner parameter 2, . . . , the memory of the process corner parameter n respectively to obtain the preset parameter table corresponding to the process corner parameter 2, . . . , the preset coefficient value corresponding to the process corner parameter n respectively, so as to obtain the preset parameter tables corresponding to different process corner parameters The above-mentioned process corner parameter 1, process corner parameter 2, . . . , process corner parameter n may characterize typical process corner (TT Corner), slow process corner (SS Corner), fast process corner (FF Corner) and so on respectively. Thus, the target parameter table is selected through the process corner parameter, and the first calibration code is selected from the target parameter table according to the current environment parameter.

In addition, the determination of the first calibration code may not involve the process corner parameter. In some embodiments, the method further includes the following operations. The current environment parameter of the memory is detected. The current environment parameter is presented to the user, so that the user selects a first calibration code from a plurality of candidate calibration codes according to preset mapping relationships. Herein, the preset mapping relationships indicate relationships between a plurality of environment parameters and a plurality of candidate calibration codes. Each environment parameter includes a voltage parameter and/or a temperature parameter.

It should be noted that the preset mapping relationships may also be stored by electronic device or recorded by the user himself.

In some embodiments, the method further includes the following operations. In a second test mode, the calibration mode signal is controlled to indicate the on-chip calibration mode. The memory is controlled to perform ZQ self-calibration process for multiple times respectively based on a plurality of environment parameter, and a plurality of candidate calibration codes are obtained to establish preset mapping relationships.

Exemplarily, it is assumed that each environment parameter includes a voltage parameter and a temperature parameter. In the initialization process of the electronic device, the second test mode may be entered automatically, and the electronic device adjusts the voltage and temperature of the memory, and controls the memory to perform ZQ self-calibration process to obtain corresponding candidate calibration code. By repeating the above processes under different temperature/voltage combinations, candidate calibration codes corresponding to different environment parameters may be obtained to establish preset mapping relationships. In addition, the electronic device may also cooperate with the temperature control device for performing test. That is, after entering the test mode, the electronic device adjusts the voltage of the memory to a corresponding predetermined value, and the temperature of the memory is adjusted by other test devices.

It should be noted that in order to simplify the operation difficulty of the user, the steps partially executed by the user mentioned in the embodiments of the present disclosure may also be selected to be automated by a software program. For example, the electronic device where the memory is located may further comprises a controller, and the controller may directly determine the first calibration code based on current environment parameter and the preset mapping relationships, and the interaction between the memory and the user may be performed between the memory and the controller accordingly. Currently, software programs are highly automated, and improvements similar to the above do not require creative effort by those skilled in the art and are therefore also to be considered as the scope of protection of the embodiments of the present disclosure.

In some embodiments, the method further includes the following operations. In a case that the calibration mode signal indicates the on-chip calibration mode and the first calibration code sent by the user is received, the first calibration code is stored. The first calibration code is determined as the ZQ calibration code after the calibration mode signal is adjusted to indicate the off-chip calibration mode. Alternatively, in a case that the calibration mode signal indicates the off-chip calibration mode and the first calibration code sent by the user is received, the received first calibration code is directly determined as the ZQ calibration code.

It should be noted that the user should send the first calibration code firstly before switching from the on-chip calibration mode to the off-chip calibration mode, so as to avoid impedance mismatch caused by the absence or inappropriateness of the first calibration code after switching from the on-chip calibration mode to the off-chip calibration mode. In addition, after the memory is already in the off-chip calibration mode, the user may still send a new first calibration code to update the ZQ calibration code.

In some embodiments, the method may further include the following operations. A resistance calibration processing is performed on the output drive circuit in the memory and the termination resistor circuit in the memory based on the ZQ calibration code.

The embodiments of the disclosure provide a method for controlling calibration. In an off-chip calibration mode, a user is allowed to directly send the first calibration code to determine the ZQ calibration code without frequent ZQ self-calibration process, which not only reduces power consumption but also saves system time, thereby reducing resource waste and improving data process performance of a memory. In addition, with the aid of process corner parameter, user may quickly and reasonably determine the first calibration code, thereby further reducing power consumption and time consumption.

The above is only preferred embodiments of the present disclosure and is not intended to limit the scope of protection of the present disclosure. It should be noted that, In the present disclosure, the terms "comprising", "including" or any other variation thereof are intended to encompass non-exclusive inclusion, so that a process, method, object or device, that includes a set of elements, includes not only those elements but also other elements that are not explicitly listed, or also elements inherent to such a process, method, object or device. In the absence of further limitations, an element defined by the phrase "comprising a . . . " does not preclude the existence of another identical element in the process, method, object or device in which it is included. The above serial numbers of the embodiments of the present disclosure are for description only and do not represent the advantages and disadvantages of the embodiments. The methods disclosed in several method embodiments provided in the present disclosure can be arbitrarily combined without conflict to obtain new method embodiments. Features disclosed in several product embodiments provided in the present disclosure can be arbitrarily combined without conflict to obtain new product embodiments. Features disclosed in several method or device embodiments provided in the present disclosure can be arbitrarily combined without conflict to obtain new method or device embodiments. The above is only the specific implementation of the present disclosure, but the scope of protection of the present disclosure is not limited thereto. The variants or substitutions within the technical scope disclosed in the present disclosure that can be easily obtained by a skilled person familiar with the technical field should be covered within the scope of protection of the present disclosure. Therefore, the scope of protection of the present disclosure shall be subject to the scope of the claims.

The embodiments of the disclosure provide a circuit for controlling calibration, an electronic device and a method for controlling calibration. With the aid of process corner parameter, a user can quickly and reasonably determine a first calibration code, and then directly set a ZQ calibration code in an off-chip calibration mode, thereby not only reducing power consumption but also saving system time.

What is claimed is:

1. A circuit for controlling calibration, applicable for a memory, comprising:
   a process circuit, configured to perform, in a first test mode, a process corner test on the memory to obtain a test result signal, wherein the test result signal is used for determining a process corner parameter;
   an off-chip calibration circuit, configured to receive and store a first calibration code sent by a controller, wherein the first calibration code is determined by the controller according to a current environment parameter of the memory and the process corner parameter; and
   a mode switching circuit, configured to receive a calibration mode signal and the first calibration code, and determine the first calibration code as a ZQ calibration code in a case that the calibration mode signal indicates an off-chip calibration mode;
   wherein the process circuit comprises a monitoring circuit and a read-write register group, wherein,
   the read-write register group is configured to receive, in the first test mode, a write instruction comprising a starting time and a closing time and store the starting time and the closing time;
   the monitoring circuit is configured to perform, in the first test mode, the process corner test on the memory based on the starting time and the closing time to obtain the test result signal; and
   the read-write register group is further configured to collect and store the test result signal, and output the test result signal in a case that a first read instruction is received.

2. The circuit for controlling calibration of claim 1, wherein,
   the process corner parameter is used for determining a target coefficient value from a plurality of preset coefficient values, wherein the preset coefficient values are used for indicating relationships between the first calibration code and environment parameters, and different preset coefficient values have corresponding relationships with different process corner parameters; and
   the first calibration code is calculated and obtained by the controller in a working process of the memory based on the target coefficient value, the current environment parameter and a calibration code basic value, wherein the calibration code basic value refers to a value of the first calibration code under a standard environment parameter.

3. The circuit for controlling calibration of claim 1, wherein,
   the process corner parameter is used for selecting a target parameter table from a plurality of preset parameter tables, wherein the preset parameter tables are used for indicating mapping relationships between different environment parameters and different values of the first calibration code, and different preset parameter tables have corresponding relationships with different process corner parameters; and
   the target parameter table is used by the controller in a working process of the memory to determine the first calibration code corresponding to the current environment parameter.

4. The circuit for controlling calibration of claim 1, wherein the calibration control circuit further comprises an on-chip calibration circuit, wherein,
   the on-chip calibration circuit is configured to receive an enable signal, and in a case that the enable signal is in an active state, perform ZQ self-calibration process on the memory to obtain a second calibration code adapted to the current environment parameter; and
   the mode switching circuit is further configured to receive the second calibration code, and determine the second calibration code as the ZQ calibration code in a case that the calibration mode signal indicates an on-chip calibration mode.

5. The circuit for controlling calibration of claim 4, wherein the mode switching circuit comprises a first selection circuit and a second selection circuit, wherein,
   the first selection circuit is configured to receive the calibration mode signal, output a selection signal in a first state and the enable signal in an inactive state in a case that the calibration mode signal indicates the off-chip calibration mode, or, output the selection signal in a second state and the enable signal in the active state in a case that the calibration mode signal indicates the on-chip calibration mode;
   the second selection circuit is configured to receive the selection signal, output the first calibration code as the ZQ calibration code in a case that the selection signal is in the first state, or, output the second calibration code as the ZQ calibration code in a case that the selection signal is in the second state.

6. The circuit for controlling calibration of claim 5, wherein the first selection circuit comprises a first write-only register, the second selection circuit comprises a multiplexer, and the off-chip calibration circuit comprises a second write-only register group, wherein,
   an input end of the first write-only register is configured to receive the calibration mode signal, and an input end of the second write-only register group is configured to receive the first calibration code, an enable end of the on-chip calibration circuit is connected with a first output end of the first write-only register to receive the enable signal; and a control end of the multiplexer is connected with a second output end of the first write-only register to receive the selection signal, a first input end of the multiplexer is connected with an output end of the on-chip calibration circuit to receive the second calibration code, a second input end of the multiplexer is connected with an output end of the second write-only register group to receive the first calibration code, and an output end of the multiplexer is configured to output the ZQ calibration code.

7. The circuit for controlling calibration of claim 6, wherein the circuit for controlling calibration further comprises a collection circuit, an input end of the collection circuit is connected with an output end of the mode switching circuit, wherein, the on-chip calibration circuit is further configured to perform, in the second test mode, ZQ self-calibration process on the memory for a standard environment parameter to obtain a calibration code basic value;

the mode switching circuit is further configured to receive, in the second test mode, the calibration mode signal indicating the on-chip calibration mode to output the calibration code basic value, and the collection circuit is configured to collect the calibration code basic value, and the calibration code basic value is used for determining the first calibration code.

8. The circuit for controlling calibration of claim 7, wherein the collection circuit comprises a read-only register group, an input end of the read-only register group is connected with the output end of the multiplexer, wherein, the read-only register group is configured to collect an output signal of the multiplexer; and the read-only register group is further configured to receive, in a second test mode, a second read instruction, and output the calibration code basic value according to the second read instruction.

9. The circuit for controlling calibration of claim 1, wherein the memory further comprises an output drive circuit and a termination resistor circuit, wherein, the memory is further configured to write the ZQ calibration code into the output drive circuit and the termination resistor circuit to implement resistance calibration process of the output drive circuit and the termination resistor circuit.

10. An electronic device comprising a memory and a controller, wherein the memory comprises a circuit for controlling calibration, and the circuit for controlling calibration comprises:

a process circuit, configured to perform, in a first test mode, a process corner test on the memory to obtain a test result signal, wherein the test result signal is used for determining a process corner parameter;

an off-chip calibration circuit, configured to receive and store a first calibration code sent by the controller, wherein the first calibration code is determined by the controller according to a current environment parameter of the memory and the process corner parameter; and a mode switching circuit, configured to receive a calibration mode signal and the first calibration code, and determine the first calibration code as a ZQ calibration code in a case that the calibration mode signal indicates an off-chip calibration mode;

wherein the process circuit comprises a monitoring circuit and a read-write register group, wherein, the read-write register group is configured to receive, in the first test mode, a write instruction comprising a starting time and a closing time and store the starting time and the closing time;

the monitoring circuit is configured to perform, in the first test mode, the process corner test on the memory based on the starting time and the closing time to obtain the test result signal; and the read-write register group is further configured to collect and store the test result signal, and output the test result signal in a case that a first read instruction is received.

11. A method for controlling calibration, applicable for an electronic device comprising a memory and a controller, comprising:

performing, in a first test mode, a process corner test on the memory to obtain a test result signal, wherein the test result signal is used for determining a process corner parameter;

receiving a first calibration code sent by the controller after providing the process corner parameter to the controller, wherein the first calibration code is determined by the controller according to a current environment parameter of the memory and the process corner parameter; and receiving a calibration mode signal, and determining the first calibration code as a ZQ calibration code in a case that the calibration mode signal indicates an off-chip calibration mode;

further comprising:

when the calibration mode signal indicates an on-chip calibration mode, controlling the memory to perform ZQ self-calibration process to obtain a second calibration code, and determining the second calibration code as the ZQ calibration code;

detecting the current environment parameter of the memory;

providing the process corner parameter, the current environment parameter and a calibration code basic value to the controller; and receiving the first calibration code, wherein the first calibration code is calculated and obtained by a target coefficient value, the calibration code basic value and the current environment parameter;

wherein the target coefficient value is selected from a plurality of preset coefficient values based on the process corner parameter, the preset coefficient values are used for indicating relationships between the first calibration code and environment parameters, different preset coefficient values have corresponding relationships with different process corner parameters, and the calibration code basic value refers to a value of the first calibration code under a standard environment parameter.

12. The method for controlling calibration of claim 11, further comprising:

controlling, in a second test mode, the calibration mode signal to indicate an on-chip calibration mode; and controlling the memory to perform the ZQ self-calibration process based on the standard environment parameter to obtain the calibration code basic value.

13. The method for controlling calibration of claim 11, wherein the method further comprises: providing, by the electronic device, the plurality of preset coefficient values to the controller;

or, wherein the method further comprises:

controlling, in a second test mode, the calibration mode signal to indicate an on-chip calibration mode;

controlling the memory to perform ZQ self-calibration process for multiple times respectively based on a plurality of environment parameters to obtain a plurality of candidate calibration codes; and fitting the plurality of environment parameters and the plurality of candidate calibration codes to determine the preset coefficient value corresponding to the process corner parameter.

14. The method for controlling calibration of claim 11, wherein the target coefficient value comprises a voltage coefficient and a temperature coefficient, the standard environment parameter comprises a standard voltage parameter and a standard temperature parameter, and the current environment parameter comprises a current voltage parameter and a current temperature parameter; wherein, a difference between the current voltage parameter and the standard voltage parameter is recorded as a voltage change value, and a difference between the current temperature parameter and the standard temperature parameter is recorded as a temperature change value; and the first calibration code is obtained by performing summing operation on the calibration code basic value, a product of the voltage change value and the voltage coefficient, and a product of the temperature change value and the temperature coefficient.

15. A method for controlling calibration, applicable for an electronic device comprising a memory and a controller, comprising:

performing, in a first test mode, a process corner test on the memory to obtain a test result signal, wherein the test result signal is used for determining a process corner parameter;

receiving a first calibration code sent by the controller after providing the process corner parameter to the controller, wherein the first calibration code is determined by the controller according to a current environment parameter of the memory and the process corner parameter:

receiving a calibration mode signal, and determining the first calibration code as a ZQ calibration code in a case that the calibration mode signal indicates an off-chip calibration mode;

when the calibration mode signal indicates an on-chip calibration mode, controlling the memory to perform ZQ self-calibration process to obtain a second calibration code, and determining the second calibration code as the ZQ calibration code;

detecting the current environment parameter of the memory;

providing the current environment parameter and the process corner parameter to the controller; and receiving the first calibration code, wherein the first calibration code is determined by a target parameter table and the current environment parameter;

wherein the target parameter table is selected from a plurality of preset parameter tables based on the process corner parameter, the preset parameter tables are used for indicating mapping relationships between different environment parameters and different values of the first calibration code, and different preset parameter tables have corresponding relationships with different process corner parameters.

16. The method for controlling calibration of claim 15, wherein the method further comprises: providing, by the electronic device, the plurality of preset parameter tables to the controller, or, wherein the method further comprises:

controlling, in a second test mode, the calibration mode signal to indicate the on-chip calibration mode;

controlling the memory to perform ZQ self-calibration process for multiple times respectively based on a plurality of environment parameters to obtain a plurality of candidate calibration codes; and determining, based on the plurality of environment parameters and the plurality of candidate calibration codes, a preset parameter table corresponding to the process corner parameter.

\* \* \* \* \*